(12) United States Patent
Bodenschatz

(10) Patent No.: US 7,212,509 B1
(45) Date of Patent: May 1, 2007

(54) METHOD FOR REGULATING A FREQUENCY OFFSET IN A BASE-STATION RECEIVER OF A DATA COMMUNICATIONS SYSTEM

(75) Inventor: Wolfgang Bodenschatz, Backnang (DE)

(73) Assignee: Marconi Communications GmbH, Backnang (DE)

( * ) Notice: Subject to any disclaimer, the term of this patent is extended or adjusted under 35 U.S.C. 154(b) by 1032 days.

(21) Appl. No.: 10/069,196

(22) PCT Filed: Aug. 15, 2000

(86) PCT No.: PCT/IB00/01179

§ 371 (c)(1), (2), (4) Date: Jul. 2, 2002

(87) PCT Pub. No.: WO01/15315

PCT Pub. Date: Mar. 1, 2001

(30) Foreign Application Priority Data

Aug. 21, 1999 (DE) .................................. 199 39 811

(51) Int. Cl.
*H04B 7/212* (2006.01)

(52) U.S. Cl. ...................................... 370/337; 370/347

(58) Field of Classification Search ................. 370/336, 370/345, 347, 348, 328, 330
See application file for complete search history.

(56) References Cited

U.S. PATENT DOCUMENTS

| 5,287,388 A | * | 2/1994 | Ogura et al. .................. 375/344 |
| 5,493,710 A | | 2/1996 | Takahara et al. |
| 5,584,066 A | | 12/1996 | Okanobu |
| 5,970,102 A | * | 10/1999 | Hwang ........................ 375/340 |
| 6,266,361 B1 | * | 7/2001 | Huang et al. ................ 375/140 |

FOREIGN PATENT DOCUMENTS

EP    0 713 298 A2    5/1996

* cited by examiner

*Primary Examiner*—Derrick W. Ferris
(74) *Attorney, Agent, or Firm*—Kirschstein, et al.

(57) ABSTRACT

A method which significantly reduces a frequency offset in a base-station receiver, with the minimum effort possible, sets a reference frequency of a demodulator in each subscriber station in such a way, that its output signal no longer has a carrier frequency portion. A reference frequency for a modulator is calculated and set using the reference frequency, set in the above manner for the demodulator of the relevant subscriber station, and using all the given predetermined converter reference frequencies in the subscriber station and in the base station, on condition that a carrier frequency which occurs in the output signal of the base-station demodulator is set to zero.

6 Claims, 1 Drawing Sheet

METHOD FOR REGULATING A FREQUENCY OFFSET IN A BASE-STATION RECEIVER OF A DATA COMMUNICATIONS SYSTEM

PRIOR ART

The present invention concerns a method for correcting frequency offset in the receiver of a base station of a data transmission system, in which the base station transmits data in time multiplex to several subscriber stations, and data transmission from subscribers to the base station occurs in time multiplex with multiple access.

A point-to-multipoint radio transmission system is known from DE 196 35 533 A1 in which data transmission occurs between a base station and several subscriber stations in time multiplex (TDM/TDMA). The base station and subscriber stations are essentially designed the same and have in their transmission branch a modulator, one or more intermediate frequency (IF) stages and a high frequency (HF) stage, and similarly in their receiving branch an RF stage, one or more HF stages, and a demodulator. The IF and RF stages, and the modulator and demodulator each have a converter controlled by a reference frequency. The reference frequencies are made available by local oscillators in corresponding frequency positions.

In the mentioned TDM/TDMA data transmission system the base station delivers messages to a number of subscriber stations in the form of a continuous data stream multiplexed with reference to time. Each of the existing subscriber stations sends its data to the base station in a time slot allocated to it individually. From the viewpoint of the base station, data bursts therefore arrive from different subscriber stations according to a stipulated schedule. The individual incoming data bursts must be demodulated as free of error as possible at the base station. To do this, it is essential that the receiver of the base station be locked onto the carrier frequency of the incoming data bursts with the greatest possible accuracy. A prerequisite for this is that a frequency offset between the data bursts received by the base station and the frequency normal of the base station be as limited as possible, ideally zero.

The underlying task of the invention is therefore to offer a method of the type just mentioned by which a frequency offset can be corrected in the receiver of a base station with the least possible demands.

ADVANTAGES OF THE INVENTION

The mentioned task is solved with the features of claim 1, in that the reference frequency of the demodulator of each subscriber station is initially set so that its output signal has no carrier frequency fraction. A reference frequency for the modulator in the subscriber station is then calculated from the reference frequency so set for the demodulator in the corresponding subscriber station and at all fixed converter reference frequencies in the base station under the condition that a carrier frequency occurring in the output signal of the demodulator of the base station and representing a frequency offset is set at zero. The reference frequency for the demodulator of the subscriber station is finally set at the calculated value.

In order to control an existing frequency offset in the receiver of the base station, the reference frequency for the modulator need only be set in the individual subscriber station at a value that can be numerically calculated in simple fashion from known quantities.

Advantageous modifications of the invention are apparent from the subclaims.

The reference frequency for the modulator of the subscriber station is therefore calculated from the condition that the sum of the reference frequencies for the modulators, demodulators and intermediate frequency converters in the base station and in the subscriber station is set at zero, the reference frequencies for the RF converter in the receiving and sending branch being the same but of opposite phase both in the base station and in the subscriber station.

The reference frequencies in the base station and in each subscriber station for frequency conversion in the modulator and demodulator and for one or more intermediate frequency converters are preferably formed by a local oscillator by multiplying the local oscillator frequency by corresponding conversion factors, and reference frequencies for the RF converters are generated by an additional local oscillator by multiplying a local oscillator frequency by corresponding conversion factors.

To control a frequency offset, the conversion factor for the modulator of the corresponding subscriber station is calculated from the condition that the sum of a first product, formed by multiplying the local oscillator frequency of the base station by the sum of the conversion factors for the modulator and demodulator and the intermediate frequency conversion factors in the receiving and sending branch, and a second product, formed by multiplying the local oscillator frequency of the subscriber station by the sum of the conversion factors for the modulator and demodulator and the intermediate frequency conversion factors in the receiving and transmitting branch, is set at zero. As a further condition, it must be stipulated that the conversion factors for the RF converters in the receiving and transmitting branch in both the base station and subscriber station be equally large but of opposite sign.

The local oscillator frequency of the base station is preferably derived in the subscriber station from the symbol rate of the data transmitted from the base station to the subscriber station.

DRAWINGS

The invention is further explained below with reference to a practical example depicted in the drawing. In the drawing.

DESCRIPTION OF A PRACTICAL EXAMPLE

Figure 1:
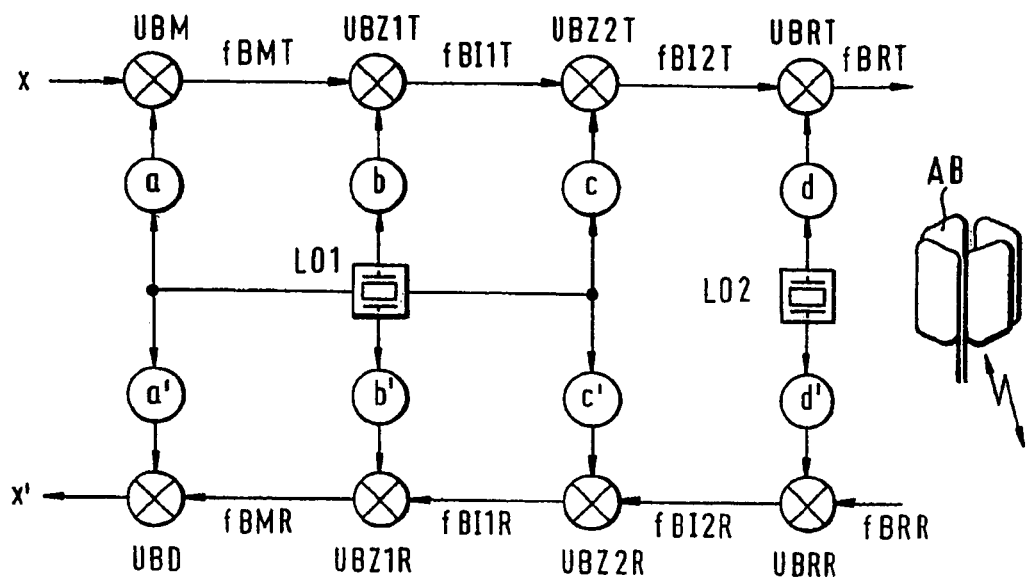
FIG. 1 shows a schematic of a base station.

A transmitting/receiving circuit of a base station of a point-to-multipoint radio system is shown in FIG. 1. Data transmission occurs between this base station and several subscriber stations, the base station transmitting a continuous time-multiplexed (TDM) data stream to the subscriber stations, which access the data bursts in the time slots of the data stream allocated to them in time multiplex with multiple access (TDMA). The individual subscriber stations also send their data in the direction of the base station according to the TDMA principle in fixed time slots. A transmitting/receiving antenna AB belonging to the base station is shown in FIG. 1. It can transmit data in several solid sectors in which the subscriber stations are located, or receive signals from these several sectors from the subscriber stations. Each subscriber station, one of which is shown as an example in FIG. 2, has an antenna AC, which is aligned on the base station and can receive signals from it or send signals to it.

Figure 2:
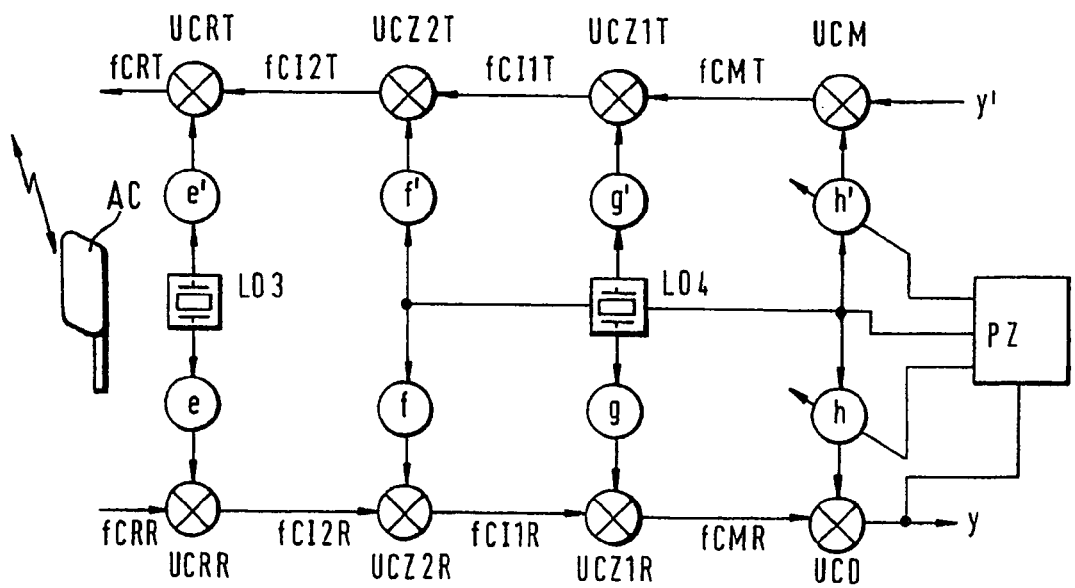
FIG. 2 shows a schematic of a subscriber station.

Since the invention involves the correction of a frequency offset, only the circuitry generating and converting all the carrier frequencies is shown in the base station and subscriber station depicted in FIGS. 1 and 2. Other circuits required for signal processing have been omitted from the depiction.

In the transmitting branch of the base station (FIG. 1), modulation signal x is modulated by converter UBM of a modulator onto a carrier that corresponds to a frequency of a first free-running local oscillator LO1 multiplied by conversion factor a. Frequency FBMT originating from converter UBM is fed to first intermediate frequency converter UBZ1T. As reference frequency, this converter UBZ1T receives the frequency of the first local oscillator LO1 multiplied by conversion factor b. The output carrier frequency fBI1T of first IF converter UBZ1T reaches the second IF converter UBZ2T. This second IF converter UBZ2T is controlled by the frequency of first local oscillator LO1 multiplied by conversion factor c. In a data transmission system only a single stage, or more than two intermediate frequency stages, can also be present, deviating from the depicted practical examples.

Output carrier frequency fBI2T of the second IF converter UBZ2T reaches the input of an RF converter UBRT. The reference frequency for this RF converter is the frequency of second free-running local oscillator LO2 multiplied by conversion factor d. The transmitting frequency fBRT is available at the output of RF converter UBRT.

In the receiving branch, RF converter UBRR is present, to which receiving frequency fBRR is fed. The reference frequency for this RF converter is again the frequency generated by a second local oscillator LO2 multiplied by conversion factor d'. Output carrier frequency fBI2R of RF converter UBRR lies at the input of IF converter UBZ2R. IF converter UBZ2R is controlled by the frequency of first local oscillator LO1 multiplied by conversion factor c'. As in the transmitting branch, additional IF converter UBZ1R is also present in the receiving branch. This converter UBZ1R converts carrier frequency FBI1R, delivered from the preceding IF converter UBZ2R by means of a frequency originating from the first local oscillator LO1 and multiplied by conversion factor b', to an intermediate frequency FBMR. This is followed by converter UBD of a demodulator that demodulates the received signal reduced to the intermediate frequency level. As reference frequency, converter UBD receives the frequency generated from local oscillator LO1 multiplied by conversion factor a'. The demodulated base band signal x' is available at the output of the converter UBD.

In the subscriber station depicted in FIG. 2, a modulator is situated in the transmitting branch with converter UCM that modulates modulation signal y' onto a carrier. For this purpose converter UCM of the modulator receives a reference frequency that corresponds to a frequency of first free-running local oscillator LO4 multiplied by conversion factor h'. Carrier frequency FCMT originating from converter UCM is fed to first intermediate frequency converter UCZ1T. This IF converter UCZ1T receives as reference frequency the frequency of first local oscillator LO4 multiplied by conversion factor g'. Output frequency FCI1T of first IF converter UCZ1T reaches second IF converter UCZ2T. This converter UCZ2T is controlled by the frequency of first local oscillator LO4 multiplied by conversion factor f'. As already explained in conjunction with the base station, deviating from the depicted practical example, the subscriber station can also be provided with only one intermediate frequency stage or there can also be more than two.

Output frequency fCI2T of second IF converter UCZ2T reaches the input of RF converter UCRT. The reference frequency for this RF converter is the frequency of second free-running local oscillator LO3 multiplied by conversion factor e'. The transmitting carrier frequency FCRT is available at the output of RF converter UCRT.

RF converter UCRR, to which receiving carrier frequency FCRR is fed, is present in the receiving branch of the subscriber station. The reference frequency for this RF converter is again the frequency generated by second local oscillator LO3 multiplied by conversion factor e. Output carrier frequency fCI2R of RF converter UCRR lies at the input of IF converter UCZ2R. This converter UCZ2R is controlled by the frequency of first local oscillator LO4 multiplied by conversion factor f.

As in the transmitting branch, an additional IF converter UCZ1R is also present in the receiving branch. This converter UCZ1R converts carrier frequency FCI1R, delivered from preceding IF converter UCZ2R by means of the frequency originating from first local oscillator LO4 multiplied by conversion factor g, to intermediate carrier frequency FCMR. A demodulator follows with converter UCD that demodulates the received signal reduced to the intermediate frequency level. As reference frequency, converter UCD receives the frequency generated by first local oscillator LO4 multiplied by conversion factor h. Demodulated received signal y is available at the output of converter UCD.

If the downlink is considered, i.e., data transmission from the base station to the subscriber station, output frequency y according to equation (1) is obtained from input frequency x of the transmitting branch of the base station and the reference frequencies for converters UBM, UBZ1T, UBZ2T, UBRT and the reference frequencies for the converters UCRR, UCZ2R, UCZ1R and UCD of the receiving branch of the subscriber station.

$$x + LO1 \cdot a + LO1 \cdot b + LO1 \cdot c + LO2 \cdot d + LO3 \cdot e + LO4 \cdot f + LO4 \cdot g + LO4 \cdot h = y \quad (1)$$

For the uplink, which is the data transmission direction from the subscriber station to the base station, carrier frequency x' is produced at the output of the modulator according to equation (2) from input frequency y' of the transmitting branch of the subscriber station and the reference frequencies for converters UCM, UCZ1T, UCZ2T, UCRT of the transmitting branch of the subscriber station and the reference frequencies for converters UBRR, UBZ2R, UBZ1R and UBD of the receiving branch of the base station.

$$y' + LO4 \cdot g' + LO4 \cdot g' + LO4 \cdot f' + LO3 \cdot e' + LO2 \cdot d' + LO1 \cdot c' + LO1 \cdot b' + LO1 \cdot a' = x' \quad (2)$$

It follows from equations (1) and (2) that:

$$x' - x = LO1 \cdot (a + b + c + a' + b' + c') + LO2 \cdot (d + d') + LO3 \cdot (e + e') + + LO4 \cdot (f + g + h + f' + g' + h') + y' - y \quad (3)$$

Since transmitting frequencies x and y' of the base station and the subscriber station are base band signals and are therefore zero by definition, equation (4) follows from equation (3).

$$x' = LO1 \cdot (a + b + c + a' + b' + c') + LO2 \cdot (d + d') + LO3 \cdot (e + e') + + LO4 \cdot (f + g + h + f' + g' + h') - y \quad (4)$$

A frequency offset in the base station is expressed by the fact that output signal x' of demodulator UBD still has a carrier frequency fraction in addition to the base band signal.

The objective is to control the frequencies so that the frequency offset in the form of a carrier frequency fraction appearing at the demodulator output of the base station disappears. This frequency offset is corrected merely by the fact that conversion factors h and h' for demodulator converter UCD and modulator converter UCM are variable in the subscriber station and are set at the desired values h'* and h*. The change in conversion factors h and h' occurs by processor PZ. To correct the frequency offset, processor PZ controls conversion factor h for converter UCD of the demodulator to a value h* so that y=0, i.e., so that a carrier frequency fraction no longer occurs in the output signal of demodulator converter UCD. Under the condition of y=0, equation (4) can be rewritten into equation (5)

$$x'=LO1 \cdot (a+b+c+a'+b'+c') + LO2 \cdot (d+d') + LO3 \cdot (e+e') + LO4 \cdot (f+g+h+f'+g'+h') \quad (5)$$

In order to correct the frequency offset, the objective is to achieve x'=0, which means that a carrier frequency fraction is no longer present in the output signal of the demodulator of the base station. In equation (5), x'=0 when the conditions according to the following equations (6), (7) and (8) are fulfilled. The conditions in equations (6) and (7) state that the conversion factors d, d' and e, e' for the RF converter in the transmitting and receiving branch of the base station and the subscriber station are equally large but must have opposite signs. This means that the reference frequencies for the converters in the transmitting and receiving branches are equal but must have a phase shift of 180°.

$$d=-d' \quad (6)$$

$$e=-e' \quad (7)$$

$$LO1 \cdot (a+b+c+a'+b'+c') + LO4 \cdot (f+g+h^*+f'+g'+h'^*)=0 \quad (8)$$

From equation (8), we obtain a new conversion factor h'* to be set by processor PZ for modulator UCM of the subscriber station according to equation (9).

$$h'^*=-(LO1/LO4) \cdot (a+b+c+a'+b'+c') - (f+g+h^*+f'+g') \quad (9)$$

If equation (9) is fulfilled for conversion factor h'*, the frequency offset is fully eliminated in the base station, i.e., a carrier frequency fraction no longer occurs in addition to the base band signal at the output of demodulator UBD.

Local oscillator frequencies LO1 and LO4 occurring in equation (9) are known from the nominal value, but the actual deviations from the reference value are not known. Under the condition that a symbol rate SRB is sent from the base station, which is derived from the clock rate of local oscillator LO1, the following applies:

$$SRB=LO1/p \quad (10)$$

In the base station, a symbol rate SRC according to equation (11) is then received, which depends on the time basis of the local oscillator LO4.

$$SRC=LO4/q \quad (11)$$

Since the symbol rate is not determined by an additional local oscillator, $$SRB=SRC \quad (12)$$

The following applies for factors p and q in equations (10), (11) and (12).

$$p/q=LO1/LO4 \quad (13)$$

Factor p is a defined value in the base station that is known to processor PZ in the subscriber station. Processor PZ determines factor q by deriving the symbol rate SRC from the received signal y and relating it according to equation (11) to the known system clock frequency of the local oscillator LO4.

For equation (13), we finally obtain, from equation (9), equation (14), according to which processor PZ calculates the conversion factor h'* to be set. The conversion factors a, b, c, a', b', c', f, g, f, g' occurring in equation (14) are fixed values and are known to processor PZ, which has also determined beforehand the new conversion factor h* for the demodulator.

$$h'^*=-(p/q) \cdot (a+b+c+a'+b'+c') - (f+g+h^*+f'+g') \quad (14)$$

The frequency synchronization discussed above is conducted between each of the subscriber stations and base stations.

An advantage of the described correction of a frequency offset in the base station consists of the fact that the local oscillators can be free-running. Flexible layout of the conversion factors is also possible so that considerable latitude is obtained for the choice of duplex frequency spacings.

The invention claimed is:

1. A method of correcting a frequency offset in a receiver of a base station of a data transmission system in which the base station sends data in time multiplex to several subscriber stations, and in which data transfer occurs from the subscriber stations to the base station in time multiplex with multiple access, comprising the steps of:
    a) setting, in each subscriber station, a reference frequency of a demodulator so that an output signal of a demodulator has no carrier frequency portion;
    b) for each subscriber station and for the base station, stipulating converter reference frequencies;
    c) for each subscriber station, calculating a calculated reference frequency for a modulator in the subscriber station from the reference frequency set for the demodulator in the subscriber station and from the stipulated converter reference frequencies under a condition that a carrier frequency, representing the frequency offset occurring in an output signal of the modulator in the base station, is set to zero; and
    d) setting an actual reference frequency for each modulator of each subscriber station to the calculated reference frequency for that modulator.

2. The method according to claim 1, in which:
    each of the subscriber stations comprises a transmitting branch comprising the modulator of that subscriber station and at least one intermediate frequency converter, and a receiving branch comprising the demodulator of that subscriber station, at least one intermediate frequency converter, and a radio frequency converter;
    the base station comprises a transmitting branch comprising a modulator and at least one intermediate frequency converter, and a receiving branch comprising a demodulator and at least one intermediate frequency converter, and a radio frequency converter; and
    each modulator, demodulator, intermediate frequency converter and radio frequency converter being provided with a reference signal having a reference frequency.

3. The method according to claim 2, wherein the calculating step is performed by, for each subscriber station, calculating the reference frequency for the modulator of the subscriber station from a condition that a sum of the reference frequencies for the modulators, demodulators, and intermediate frequency converters in the base station and in the subscriber station is set at zero, reference signals of the radio frequency converters in the base station and the subscriber stations being equal in frequency in the respective receiving and transmitting branches, but of opposite phase.

4. The method according to claim 2, wherein the reference frequencies in the base station and in each subscriber station for frequency conversion in the modulators, demodulators, and for the intermediate frequency converters thereof are formed by a first local oscillator by multiplying a first local oscillator frequency by corresponding conversion factors, and wherein the reference frequencies for the radio frequency converters are generated by a second local oscillator by multiplying a second local oscillator frequency by corresponding conversion factors.

5. The method according to claim 4, wherein the conversion factor for the modulator of each subscriber station is calculated from a condition that a sum of a first product, formed by multiplying the first local oscillator frequency of the base station by a sum of the conversion factors corresponding to the modulator and the demodulator and of the conversion factors corresponding to the intermediate frequency converters in the receiving and transmitting branch, and a second product, formed by multiplying the first local oscillator frequency of the subscriber station by a sum of the conversion factors corresponding to the modulator and the demodulator and of the conversion factors corresponding to the intermediate frequency converters in the receiving and transmitting branch, are set at zero, and wherein the conversion factors corresponding to the radio frequency converters in the receiving and transmitting branches both in the base station and in the subscriber station are equal in size, but of opposite sign.

6. The method according to claim 5, wherein the first local oscillator frequency of the base station is derived in the subscriber station from a symbol rate of data transmitted from the base station to the subscriber station.

* * * * *

UNITED STATES PATENT AND TRADEMARK OFFICE
CERTIFICATE OF CORRECTION

PATENT NO. : 7,212,509 B1
APPLICATION NO. : 10/069196
DATED : May 1, 2007
INVENTOR(S) : Bodenschatz It is certified that error appears in the above-identified patent and that said Letters Patent is hereby corrected as shown below:

In Column 3, Line 12, delete "FBMT" and insert -- fBMT --, therefor.

In Column 3, Line 41, delete "FBI1R," and insert -- fBI1R, --, therefor.

In Column 3, Line 44, "FBMR." and insert -- fBMR. --, therefor.

In Column 3, Line 58, delete "FCMT" and insert -- fCMT --, therefor.

In Column 3, Line 62, delete "FCI1T" and insert -- fCI1T --, therefor.

In Column 4, Line 8, delete "FCRT" and insert -- fCRT --, therefor.

In Column 4, Line 11, delete "FCRR" and insert -- fCRR --, therefor.

In Column 4, Line 21, delete "FCI1R," and insert -- fCI1R, --, therefor.

In Column 4, Line 25, delete "FCMR." and insert -- fCMR. --, therefor.

In Column 5, Equation (6), Line 1, delete "d--d'" and insert -- d=-d' --, therefor.

Signed and Sealed this

Thirteenth Day of January, 2009

JON W. DUDAS
*Director of the United States Patent and Trademark Office*